(12) United States Patent
Blalock

(10) Patent No.: US 7,582,562 B2
(45) Date of Patent: Sep. 1, 2009

(54) ATOMIC LAYER DEPOSITION METHODS

(75) Inventor: Guy T. Blalock, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 435 days.

(21) Appl. No.: 11/244,859

(22) Filed: Oct. 6, 2005

(65) Prior Publication Data

US 2007/0082468 A1    Apr. 12, 2007

(51) Int. Cl.
*H01L 21/44* (2006.01)
(52) U.S. Cl. .............. 438/680; 257/E21.269; 257/E21.274; 438/685
(58) Field of Classification Search ............ 438/762, 438/763, 680, 685; 257/E21.269, E21.274
See application file for complete search history.

(56) References Cited

U.S. PATENT DOCUMENTS

| | | | |
|---|---|---|---|
| 6,548,424 B2 | 4/2003 | Putkonen | |
| 6,689,220 B1 | 2/2004 | Nguyen | |
| 6,767,582 B1 | 7/2004 | Elers | |
| 6,831,315 B2 * | 12/2004 | Raaijmakers et al. | 257/296 |
| 7,144,806 B1 * | 12/2006 | Fair et al. | 438/653 |
| 2002/0042165 A1 | 4/2002 | Putkonen | |
| 2002/0081844 A1 | 6/2002 | Jeon et al. | |
| 2002/0106451 A1 | 8/2002 | Skarp et al. | |
| 2003/0096468 A1 | 5/2003 | Soininen et al. | |
| 2003/0113480 A1 | 6/2003 | Kil et al. | |
| 2004/0014295 A1 | 1/2004 | Kim | |
| 2004/0029379 A1 | 2/2004 | Yamasaki et al. | |
| 2004/0077182 A1 * | 4/2004 | Lim et al. | 438/785 |
| 2004/0094093 A1 | 5/2004 | Sneh | |
| 2004/0137167 A1 | 7/2004 | Nguyen | |
| 2004/0224504 A1 * | 11/2004 | Gadgil | 438/680 |
| 2005/0095443 A1 * | 5/2005 | Kim et al. | 428/469 |

FOREIGN PATENT DOCUMENTS

EP    1242647 B1    8/2003

OTHER PUBLICATIONS

Besling et al., *Atomic Layer Deposition of Barriers for Interconnect*, IEEE 2002, pp. 288-291.
Choi et al., *New Approaches to Improve the Endurance of TiN/HfO₂/TiN Capacitor during the Back-end Process for 70nm DRAM Device*, IEEE 2003, IEDM 03-661-664.
Eisenbraun et al., *Atomic Layer Deposition (ALD) of Tantalum-based Materials for Zero Thickness Copper Barrier Applications*, IEEE 2001, pp. 207-209.

* cited by examiner

*Primary Examiner*—Asok K Sarkar
(74) *Attorney, Agent, or Firm*—Wells St. John P.S.

(57) ABSTRACT

An atomic layer deposition method includes providing a semiconductor substrate within a deposition chamber. A first metal halide-comprising precursor gas is flowed to the substrate within the chamber effective to form a first monolayer on the substrate. The first monolayer comprises metal and halogen of the metal halide. While flowing the first metal halide-comprising precursor gas to the substrate, $H_2$ is flowed to the substrate within the chamber. A second precursor gas is flowed to the first monolayer effective to react with the first monolayer and form a second monolayer on the substrate. The second monolayer comprises the metal. At least some of the flowing of the first metal halide-comprising precursor gas, at least some of the flowing of the $H_2$, and at least some of the flowing of the second precursor gas are repeated effective to form a layer of material comprising the metal on the substrate.

28 Claims, 6 Drawing Sheets

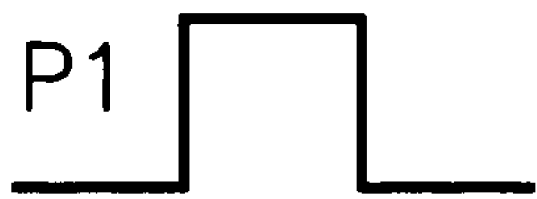
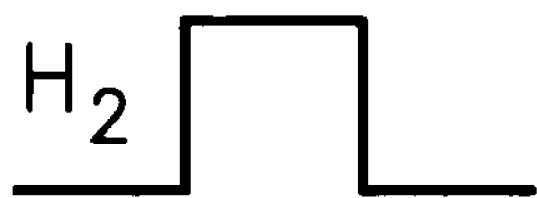
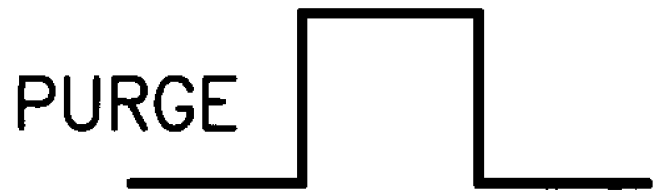

ATOMIC LAYER DEPOSITION METHODS

TECHNICAL FIELD

This invention relates to atomic layer deposition methods.

BACKGROUND OF THE INVENTION

Semiconductor processing in the fabrication of integrated circuitry typically includes the deposition of layers on semiconductor substrates. One such method is atomic layer deposition (ALD), which involves the deposition of successive monolayers over a substrate within a deposition chamber, typically maintained at subatmospheric pressure. With typical ALD, successive mono-atomic layers are adsorbed to a substrate and/or reacted with the outer layer on the substrate, typically by the successive feeding of one or more deposition precursors to the substrate surface.

By way of example only, an exemplary ALD method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor that is not adhering to the substrate from the chamber. Alternately, perhaps no purge gas is utilized. Subsequently, a second vapor deposition precursor, the same or different from the first precursor, is flowed to the chamber effective to form a second monolayer on or with the first monolayer. The second monolayer might react with the first monolayer. Additional precursor flows can form successive monolayers, or the above process can be repeated until a desired thickness and composition layer has been formed over the substrate.

Exemplary types of materials deposited by ALD include metals and metal compounds. Common precursors used in depositing metal and metal compounds by ALD include metal halides, for example $TiCl_4$. A typical intent in ALD involving such a metal halide is to flow $TiCl_4$ to the substrate, preferably causing $TiCl_x$ to chemisorb to available bonding sites on a substrate, with one or more chlorine atoms being a by-product either as chlorine atoms or chlorine gas ($Cl_2$) as an effluent. The remaining $TiCl_x$ will be positively charged, and provide an available bonding site for subsequent monolayer formation thereon or therewith. If elemental titanium is the desired layer to be deposited, subsequent flowing of $TiCl_4$ can desirably replace the $Cl_x$ with $TiCl_x$ thereby creating $Ti$—$TiCl_x$ bonds. Subsequent $TiCl_4$ precursor flows can desirably result in an increasing thickness/growing elemental Ti layer. Alternately by way of example only, alternating $TiCl_4$ and $NH_3$ flows can be utilized to form TiN.

Regardless, a perfectly saturated monolayer of the $TiCl_x$ moiety is typically not the result. Further and accordingly, otherwise available $TiCl_x$ bonding sites might be occupied by chlorine atoms. Further and regardless, not all of the chlorine atoms of the $TiCl_x$ monolayers will necessarily be removed from the layer, thereby undesirably resulting in some chlorine incorporation in the layer being formed. Accordingly, it would be desirable to reduce the incorporation of chlorine or other halogens in deposited layers utilizing metal halides as deposition precursors.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes atomic layer deposition methods. In one implementation, an atomic layer deposition method includes providing a semiconductor substrate within a deposition chamber. A first metal halide-comprising precursor gas is flowed to the substrate within the chamber effective to form a first monolayer on the substrate. The first monolayer comprises metal and halogen of the metal halide of the first metal halide-comprising precursor gas. While flowing the first metal halide-comprising precursor gas to the substrate within the chamber, $H_2$ is flowed to the substrate within the chamber. A second precursor gas is flowed to the first monolayer effective to react with the first monolayer and form a second monolayer on the substrate. The second monolayer comprises the metal. At least some of the flowing of the first metal halide-comprising precursor gas, at least some of the flowing of the $H_2$, and at least some of the flowing of the second precursor gas are repeated effective to form a layer of material comprising the metal on the substrate.

BRIEF DESCRIPTION OF THE DRAWINGS

Preferred embodiments of the invention are described below with reference to the following accompanying drawings.

FIG. 14 is a series of common timelines showing exemplary gas flows of processing in accordance with aspects of the invention.

DETAILED DESCRIPTION OF THE PREFERRED EMBODIMENTS

Figure 1:
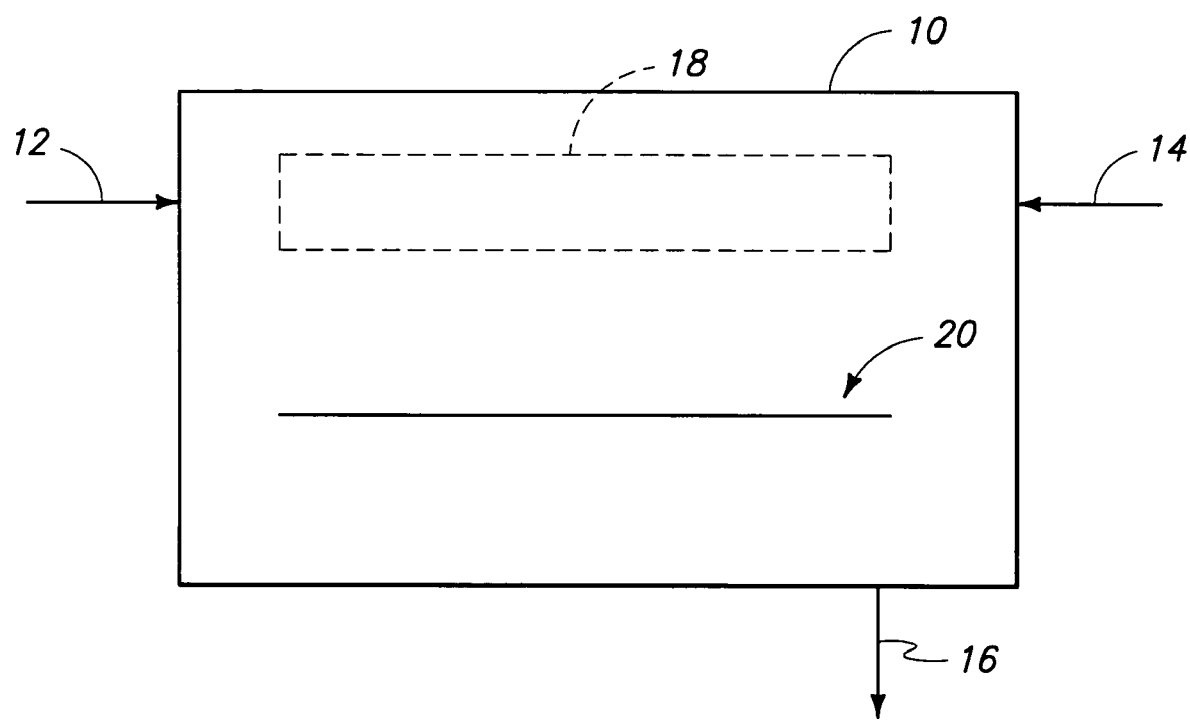
FIG. 1 is a diagrammatic section view of a deposition chamber in use in accordance with an aspect of the invention.

This disclosure of the invention is submitted in furtherance of the constitutional purposes of the U.S. Patent Laws "to promote the progress of science and useful arts" (Article 1, Section 8).

The invention encompasses atomic layer deposition. Atomic layer depositing (ALD) typically involves formation of successive atomic layers on a substrate. Described in summary, ALD includes exposing an initial substrate to a first chemical species to accomplish chemisorbtion. of the species onto the substrate. Theoretically, the chemisorbtion forms a monolayer that is uniformly one atom or molecule thick on the entire exposed initial substrate. In other words, a saturated monolayer is preferably formed. Practically, chemisorbtion might not occur on all portions or completely over the desired substrate surfaces. Nevertheless, such an imperfect monolayer is still considered a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto/with the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or a chemisorbed species. Examples of carrier gases include nitrogen, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. Further, local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

FIG. 1 diagrammatically depicts an exemplary deposition chamber 10 comprising two gas inlets 12 and 14, and a gas outlet 16. More or fewer inlets, and/or additional outlets, might of course be used. Inlets 12 and 14 might feed to a showerhead 18 for emitting gaseous precursors and/or purge gases across a broad area of the internal volume of chamber 10. A semiconductor substrate 20 is diagrammatically shown as being received within deposition chamber 10, and over which material will be deposited by methods which at least comprise atomic layer deposition. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
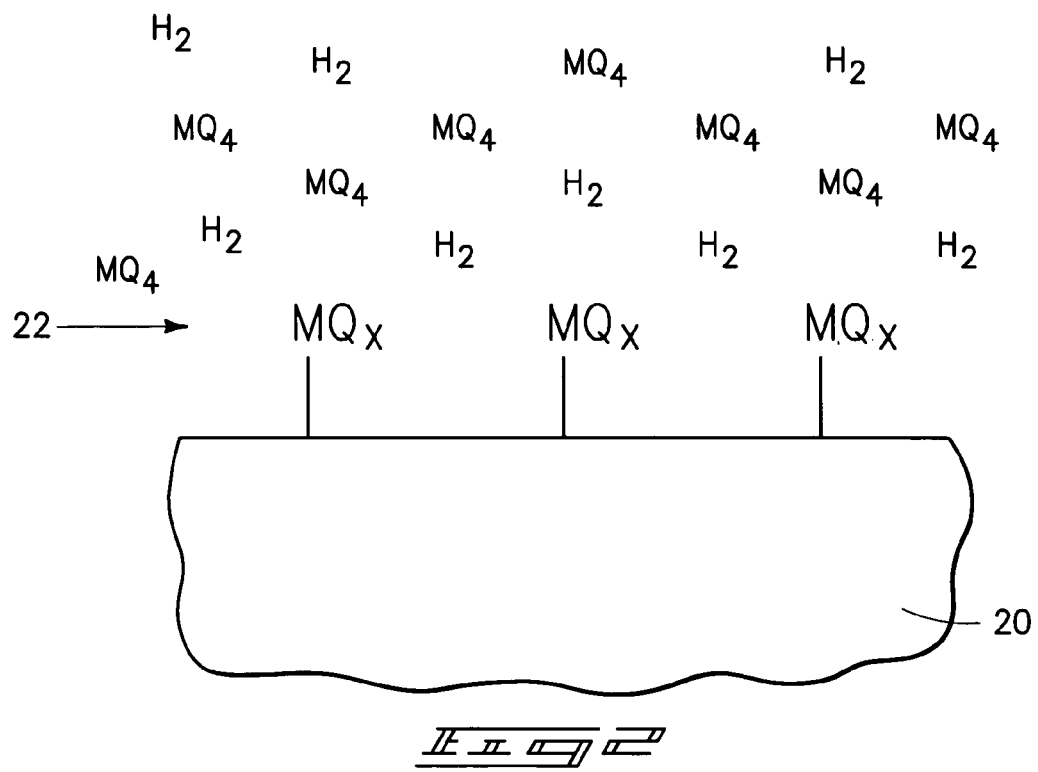
FIG. 2 is a diagrammatic view of a semiconductor substrate in process in accordance with an aspect of the invention.

Referring to FIG. 2, a portion of semiconductor substrate 20 is depicted in process in accordance with an aspect of the invention. The outer surface of substrate 20 might comprise any of insulative, conductive, and/or semiconductive materials. A first metal halide-comprising precursor gas has been flowed to the substrate within chamber 10 effective to form a first monolayer 22 comprising metal and halogen of the metal halide of the first metal halide-comprising precursor gas. In the depicted exemplary embodiment, the metal halide preferably comprises $MQ_4$, where M is the metal and Q is the halide. The first metal halide-comprising precursor gas might comprise, consist essentially of, or consist of metal halide precursor. Regardless, while flowing the first metal halide-comprising precursor gas to the substrate within the chamber, $H_2$ has also been flowed to the substrate within the chamber. FIG. 2 depicts the presence of both $MQ_4$ and $H_2$ in combination received over semiconductor substrate 20, and the deposited monolayer comprising $MQ_x$, for example where x is less than 4.

For a six liter single wafer deposition chamber, an exemplary preferred flow rate for the $MQ_4$ is from 100 sccm to 2,000 sccm, while that for the $H_2$ is from 500 sccm to 5,000 sccm. Q might comprise any one or combination of the halogens, with exemplary preferred metals M including Ti, Ta, and W. Of course, multiple wafer processors could be used. Further and regardless, the $H_2$ might comprise one or a combination of deuterium and/or tritium. An exemplary preferred substrate temperature range is from 200° C. to 500° C., with an exemplary preferred internal chamber pressure being from 10 mTorr to 20 Torr. In one preferred embodiment, hydrogen of the $H_2$ reacts with halogen Q displaced from the $MQ_4$ in the formation of monolayer 22, preferably precluding or at least reducing occupation of parasitic atomic Q to available bonding sites on substrate 20. Further and regardless, the hydrogen of the $H_2$ might also scavenge halogen from other sources, such as from the precursor gas or halogen release the result of showerhead, wall, or other internal chamber component interaction.

$H_2$ might be emitted into the chamber from a port separate from that which the first metal halide-comprising precursor gas is emitted into the chamber. Alternately by way of example only, such might be emitted into the chamber from common ports. For example, FIG. 1 depicts two exemplary inputs 12 and 14 from which the respective $H_2$ and first metal halide-comprising precursor gas would flow to chamber 10. By way of example only, such might flow to a showerhead 18 prior to emission within chamber 10, and thereby be emitted from common gas injection ports into chamber 10. Alternately, such might be emitted from separate showerheads or, in the absence of a showerhead, such might be emitted into the chamber from separate ports.

Figure 3:
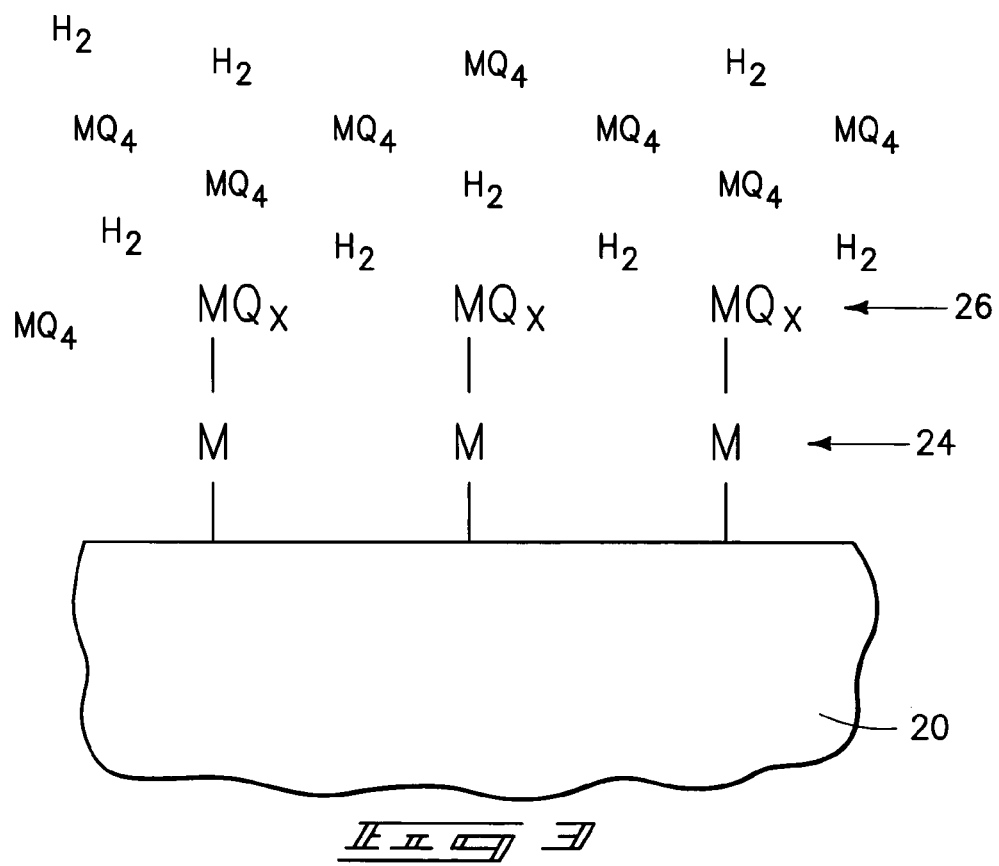
FIG. 3 is a view of the FIG. 2 substrate at a processing step subsequent to that shown by FIG. 2.
Figure 4:
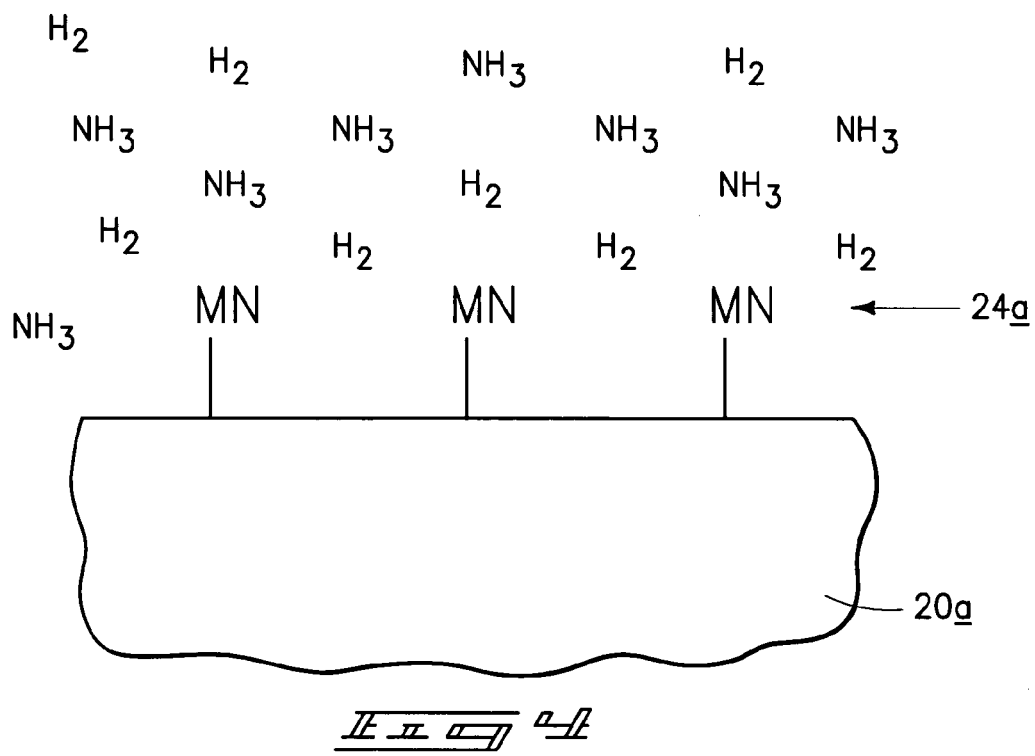
FIG. 4 is a diagrammatic view of a semiconductor substrate in process in accordance with an aspect of the invention.

Referring to FIG. 3, a second precursor gas has been flowed to the first monolayer effective to react with the first monolayer and form a second monolayer 24 on the substrate, with the second monolayer comprising the metal. The first metal halide-comprising precursor gas and the second precursor gas might be of the same composition or of different compositions. Further if of different compositions, the second precursor gas need not comprise a metal halide. Further, $H_2$ might or might not be flowed to the chamber during flow of the second precursor gas. By way of example only, FIG. 3 depicts a situation where the second precursor gas is the same as the first metal-comprising precursor gas, and whereby second monolayer 24 comprises the metal M in elemental form, and also resulting in a third monolayer 26 essentially and in this example being of the same composition as first monolayer 22 in FIG. 2. Alternately by way of example only, FIG. 4 depicts an alternate embodiment substrate 20a comprising a second monolayer 24a comprising a metal nitride depicted as MN. Such can result where the second metal precursor gas comprises nitrogen, for example $N_2$ and/or $NH_3$. Regardless, in one preferred embodiment, second monolayer 24/24a is preferably void of the halogen, for example with available hydrogen from the $H_2$ facilitating reaction with the halogen from the $MQ_x$ of the first monolayer 22, typically forming HQ.

At least some of the flowing of the first metal halide-comprising precursor gas, at least some of the flowing of the $H_2$, and at least some of the flowing of the second precursor gas are repeated effective to form a layer of material comprising the metal on the substrate (i.e., either in elemental, compound, and/or alloy form). The repeating might be of identical processing (meaning identical parameters such as temperature, pressure, precursor gas composition, flow rates, etc.) or repeated with modified parameters.

Plasma conditions within chamber 10 might be utilized during any one or all of the flowing of the first metal halide-comprising precursor gas, the flowing of the $H_2$, and the flowing of the second precursor gas. Alternately of course, no plasma might be utilized within chamber 10 during any or all of the stated gas flowings. Further alternately or in addition thereto, remote plasma might be generated with any one or all of the $H_2$, first metal halide-comprising precursor gas, and second precursor gas prior to flowing such to the chamber. Where plasma conditions are utilized within the chamber during the flowing of the first metal halide-comprising precursor gas, such are preferably at a power level below which the exemplary depicted first monolayer 22 would form to be essentially charge neutral, for example not at a high enough power level where all halogen is removed such that the same is not present in the first monolayer. Further, an exemplary preferred maximum plasma power where plasma is utilized within chamber 10 is no greater than 0.003 Watt/$mm^2$, with a power of 200 Watts or less per 300 mm diameter wafer being a specific preferred example. Activated first metal halide-comprising precursor gas and/or $H_2$ by plasma is preferred, thereby facilitating halogen removal in the formation of at least first monolayer 22.

Further preferably, and as shown in FIGS. 3 and 4, $H_2$ flows to the chamber also while the second precursor gas flows to the chamber, although such is not required.

Figure 5:
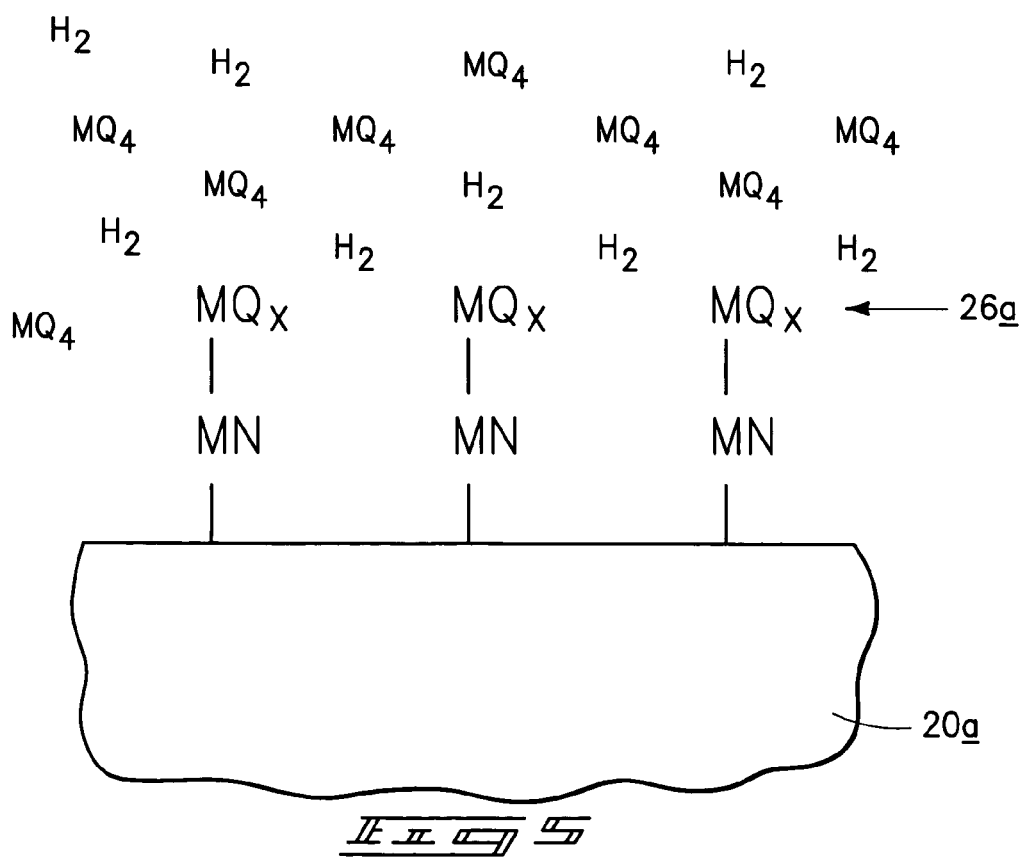
FIG. 5 is a view of the FIG. 4 substrate at a processing step subsequent to that shown by FIG. 4.

FIG. 5 depicts exemplary subsequent processing to that of semiconductor substrate 20a of FIG. 4 whereby a third monolayer 26a is formed from flowing a combination of $MQ_4$ and $H_2$ to the substrate. Subsequent alternating flows of $NH_3$, for example, and $MQ_4$ would result in formation of a growing metal nitride layer. Of course, alternate materials to metal nitrides and elemental form metal are also contemplated.

The first metal halide-comprising precursor gas and the $H_2$ might be flowed to the chamber from a common starting time, or from different starting times. Further and regardless, the first metal halide-comprising precursor gas and the $H_2$ might be flowed to the chamber to a common ending time or to different ending times. By way of example only, exemplary time lines for the first metal halide-comprising precursor flow and the $H_2$ flow are initially described with reference to FIGS. 6-10.

Figure 6:
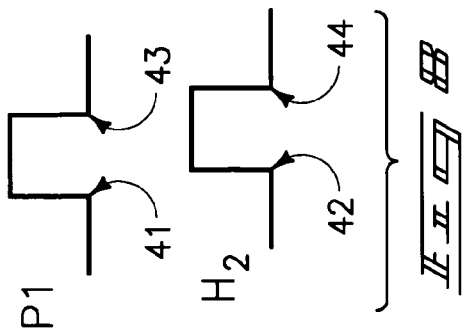
FIG. 6 is a series of common timelines showing exemplary gas flows of processing in accordance with aspects of the invention.

FIG. 6 depicts respective common/overlapping timelines for first metal halide-comprising precursor gas flow P1 and $H_2$ flow to a deposition chamber within which a substrate is received from an exemplary zero flow to a maximum flow, and returning to a zero flow. Other processing is contemplated, of course, with respect to power application where plasma is utilized, and certain aspects of continuous and/or minimum gas flows as described in our co-pending U.S. patent application Ser. No. 10/293,072 filed on Nov. 12, 2002, naming Trung Tri Doan, Guy T. Blalock and Gurtej S. Sandhu as inventors, and titled "Atomic Layer Deposition Methods", which is now U.S. Patent Publication No. 2004-0092132 A1, the disclosure of which is fully incorporated herein by reference as if included in its entirety herein. Accordingly, processing as therein described is also contemplated in this application, for example and by way of example only, in the utilization of surface microwave plasma. FIG. 6 depicts first precursor gas flow P1 and flow $H_2$ having common starting times 30 and 32, respectively, and common ending times 34 and 36, respectively.

Figure 7:
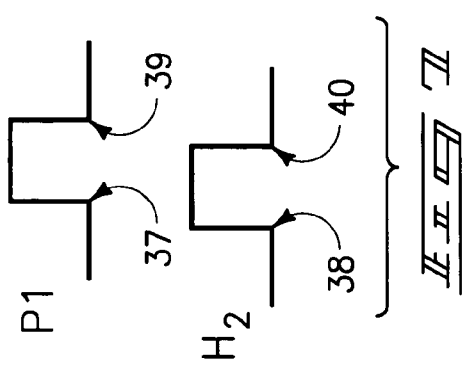
FIG. 7 is an alternate series of common timelines to that depicted by FIG. 6.
Figure 8:
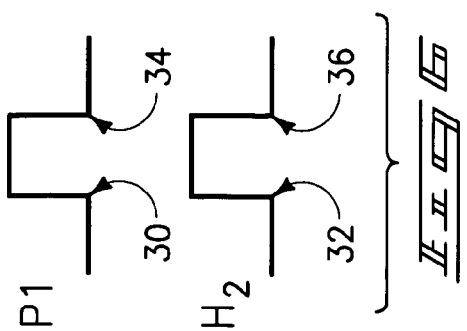
FIG. 8 is an alternate series of common timelines to that depicted by FIG. 6.

FIG. 7 depicts first precursor gas flow P1 and $H_2$ flow having different starting times 37 and 38, respectively, and different ending times 39 and 40, respectively, with $H_2$ flow starting at time point 38 before time point 37 at which the first precursor gas starts to flow. Further by way of example only, FIG. 7 depicts $H_2$ flow ending at time point 40 before ending time point 39 of first precursor gas flow P1. Alternately by way of example only, FIG. 8 depicts different first precursor gas flows P1 and $H_2$ starting times 41 and 42, respectively, and different respective ending times 43 and 44. In the depicted FIG. 8 example, $H_2$ flow starts at time point 42 which is after flow start time point 41 for the first precursor gas P1, and with $H_2$ gas flow ceasing at time point 44 after time point 43 at which first precursor P1 stops flowing.

Figure 9:
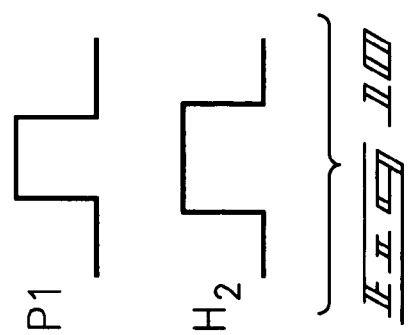
FIG. 9 is an alternate series of common timelines to that depicted by FIG. 6.
Figure 10:
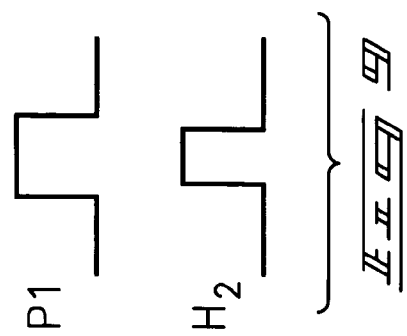
FIG. 10 is an alternate series of common timelines to that depicted by FIG. 6.

FIGS. 6-8 depict exemplary common P1 and $H_2$ flow time periods and amplitudes. Of course alternately by way of example only, different time periods and/or different amplitude flows are contemplated. For example, and by way of example only, FIG. 9 depicts an exemplary situation where the $H_2$ flow time period is less than that of the first precursor gas flow time period. Likewise by way of example only, FIG. 10 depicts an opposite situation where the $H_2$ flow time period is greater than that of the first precursor P1 flow time period, and preferably where $H_2$ flow starts before that of P1 and, as well, ends after the flow of P1 ends.

FIGS. 6-10 are exemplary only, with any combination of amplitude, time period, starting and ending flows being, of course, contemplated in accordance with the invention.

Figure 13:
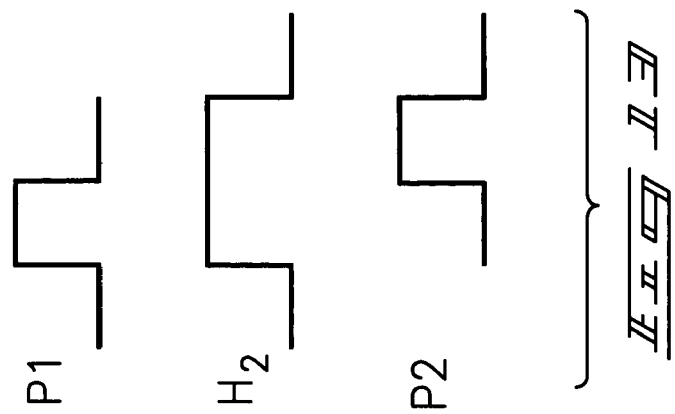
FIG. 13 is an alternate series of common timelines to that depicted by FIG. 11.
Figure 12:
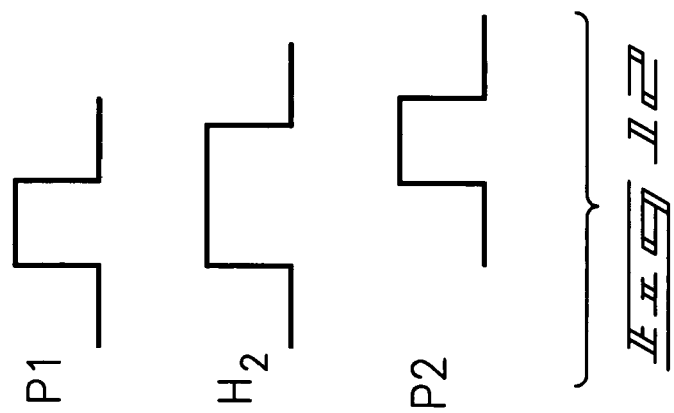
FIG. 12 is an alternate series of common timelines to that depicted by FIG. 11.
Figure 11:
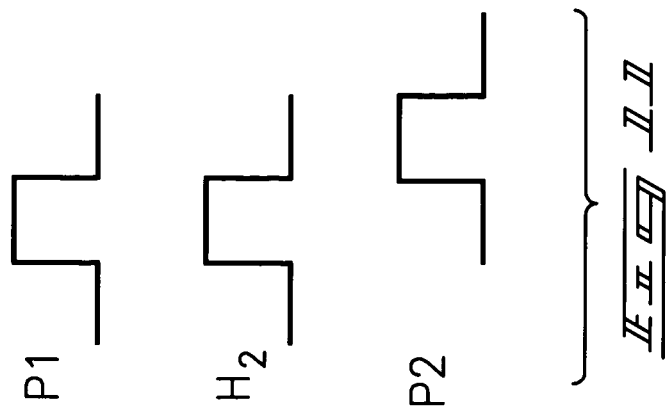
FIG. 11 is a series of common timelines showing exemplary gas flows of processing in accordance with aspects of the invention.

Further by way of example only, FIGS. 11-14 depict alternate exemplary flows in conjunction with a second precursor gas designated with time lines P2. By way of example only, FIG. 11 depicts gas flows whereby none of the $H_2$ flow occurs during the flow of second precursor gas P2. Alternately by way of example only, FIGS. 12 and 13 show overlap of the $H_2$ and P2 gas flows. Any conceivable alternate flow of the respective P1, $H_2$ and P2 flows is also, of course, contemplated. Further by way of example only, continuous $H_2$ flow during the deposition with the flowing of the first precursor gas and the flowing of the second precursor gas is also of course contemplated, for example as shown in FIG. 13. Continuous $H_2$ flow without pulsing is also of course contemplated. Further, one or more inert purge gas flows might be utilized at some point intermediate the precursor P1 and precursor P2 flows, for example as shown in FIG. 14.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method, comprising:
   providing a semiconductor substrate within a deposition chamber;
   flowing a first metal halide-comprising precursor gas to the substrate within the chamber under conditions which form a first monolayer on the substrate and thereafter stopping said flowing of the first metal halide-comprising precursor gas to the substrate, the first monolayer comprising metal and halogen of the metal halide of the first metal halide-comprising precursor gas;
   while flowing the first metal halide-comprising precursor gas to the substrate within the chamber, flowing $H_2$ to the substrate within the chamber, the $H_2$-flowing to the substrate starting before the flowing of the first metal halide-comprising precursor gas to the substrate, the $H_2$-flowing to the substrate ceasing after stopping said flowing of the first metal halide-comprising precursor gas to the substrate;
   flowing a second precursor gas to the first monolayer under conditions which react with the first monolayer and form a second monolayer on the substrate, the second monolayer comprising the metal; and
   repeating at least some of the flowing of the first metal halide-comprising precursor gas, at least some of the flowing of the $H_2$, and at least some of the flowing of the second precursor gas under conditions which form a layer of material comprising the metal on the substrate.

2. The method of claim 1 wherein the metal halide comprises $MQ_4$, where M is the metal and Q is a halogen, and the first monolayer comprises $MQ_x$, where x is less than 4.

3. The method of claim 2 wherein Q is combination of different halogens.

4. The method of claim 1 wherein the first metal halide-comprising precursor gas and the second precursor gas are of the same composition.

5. The method of claim 1 wherein the first metal halide-comprising precursor gas and the second precursor gas are of different compositions.

6. The method of claim 5 wherein the second precursor gas does not comprise a metal halide.

7. The method of claim 5 wherein the second metal precursor gas comprises nitrogen, and the second monolayer comprises a metal nitride.

8. The method of claim 1 wherein the second monolayer comprises the metal in elemental form.

9. The method of claim 1 wherein the second monolayer is void of the halogen.

10. The method of claim 1 wherein the $H_2$ comprises deuterium.

11. The method of claim 1 wherein the $H_2$ comprises tritium.

12. The method of claim 1 comprising plasma conditions in the chamber during the flowing of the first metal halide-comprising precursor gas, the flowing of the $H_2$, and the flowing of the second precursor gas.

13. The method of claim 1 comprising generating a remote plasma with the $H_2$ prior to flowing it to the chamber.

14. The method of claim 1 comprising generating a remote plasma with the first metal halide-comprising precursor gas prior to flowing it to the chamber.

15. The method of claim 1 comprising generating a remote plasma with the first metal halide-comprising precursor gas prior to flowing it to the chamber, and generating a remote plasma with the $H_2$ prior to flowing it to the chamber.

16. The method of claim 1 comprising plasma conditions in the chamber during the flowing of the first metal halide-comprising precursor gas, the plasma conditions being at a power below which the first monolayer is charge neutral.

17. The method of claim 1 comprising plasma conditions in the chamber during the flowing of the first metal halide-comprising precursor gas, the plasma conditions being at a power no greater than 0.003 Watt/mm$^2$.

18. The method of claim 1 wherein the chamber is void of plasma within the chamber during the flowing of the first metal halide-comprising precursor gas, the flowing of the $H_2$, and the flowing of the second precursor gas.

19. The method of claim 18 being void of remote plasma generation of any of the first metal halide-comprising precursor gas, the $H_2$, and the second precursor gas.

20. The method of claim 1 wherein the $H_2$ is emitted into the chamber from a port separate from that which the first metal halide-comprising precursor gas is emitted into the chamber.

21. The method of claim 1 comprising flowing an inert purge gas to the chamber intermediate the flowing of the first and second precursors to the chamber.

22. The method of claim 1 wherein the $H_2$ flows to the chamber while the second precursor gas flows to the chamber.

23. The method of claim 22 wherein the first metal halide-comprising precursor gas and the second precursor gas are of different compositions.

24. The method of claim 22 wherein the $H_2$ flows to the chamber continuously with the flowing of the first precursor gas and the flowing of the second precursor gas.

25. The method of claim 24 wherein the first metal halide-comprising precursor gas and the second precursor gas are of different compositions.

26. An atomic layer deposition method, comprising:
   providing a semiconductor substrate within a deposition chamber;
   flowing a first metal halide-comprising precursor gas to the substrate within the chamber under conditions which form a first monolayer on the substrate, the metal halide comprises $MQ_4$, where M is the metal and Q is a combination of different halogens, and the first monolayer comprises $MQ_x$, where x is less than 4, plasma conditions being in the chamber during the flowing of the first metal halide-comprising precursor gas, the plasma conditions being at a power below which the first monolayer is charge neutral;

while flowing the first metal halide-comprising precursor gas to the substrate within the chamber, flowing $H_2$ to the substrate within the chamber;

flowing a second precursor gas to the first monolayer under conditions which react with the first monolayer and form a second monolayer on the substrate, the second monolayer comprising the metal M and being void of the halogen; and repeating at least some of the flowing of the first metal halide-comprising precursor gas, at least some of the flowing of the $H_2$, and at least some of the flowing of the second precursor gas under conditions which form a layer of material comprising the metal M on the substrate.

27. An atomic layer deposition method, comprising:

providing a semiconductor substrate within a deposition chamber;

flowing a first metal halide-comprising precursor gas to the substrate within the chamber from a first showerhead within the chamber under conditions which form a first monolayer on the substrate, the first monolayer comprising metal and halogen of the metal halide of the first metal halide-comprising precursor gas;

while flowing the first metal halide-comprising precursor gas to the substrate within the chamber, flowing $H_2$ to the substrate within the chamber from a second showerhead within the chamber that is different from the first showerhead; and flowing a second precursor gas to the first monolayer under conditions which react with the first monolayer and form a second monolayer on the substrate, the second monolayer comprising the metal.

28. An atomic layer deposition method, comprising:

providing a semiconductor substrate within a deposition chamber;

flowing a first metal halide-comprising precursor gas to the substrate within the chamber under conditions which form a first monolayer on the substrate, the first monolayer comprising metal and halogen of the metal halide of the first metal halide-comprising precursor gas;

while flowing the first metal halide-comprising precursor gas to the substrate within the chamber, flowing $H_2$ to the substrate within the chamber;

flowing a second precursor gas to the first monolayer under conditions which react with the first monolayer and form a second monolayer on the substrate, the second precursor gas comprising a combination of $N_2$ and $NH_3$, and the second monolayer comprising a metal nitride comprising the metal; and while flowing the second precursor gas to the first monolayer, flowing $H_2$ within the chamber.

* * * * *

UNITED STATES PATENT AND TRADEMARK OFFICE
CERTIFICATE OF CORRECTION

PATENT NO. : 7,582,562 B2 Page 1 of 1
APPLICATION NO. : 11/244859
DATED : September 1, 2009
INVENTOR(S) : Guy T. Blalock It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 765 days.

Signed and Sealed this

Fourteenth Day of September, 2010

David J. Kappos
*Director of the United States Patent and Trademark Office*